United States Patent [19]
Beckwith

[11] Patent Number: 4,851,795
[45] Date of Patent: Jul. 25, 1989

[54] MINIATURE WIDE-BAND MICROWAVE POWER DIVIDER

[75] Inventor: William B. Beckwith, Phoenix, Ariz.

[73] Assignee: Motorola, Inc., Schaumburg, Ill.

[21] Appl. No.: 164,038

[22] Filed: Mar. 4, 1988

[51] Int. Cl.$^4$ .............................................. H03H 7/48
[52] U.S. Cl. .................................. 333/100; 333/118; 333/124
[58] Field of Search ............... 333/100, 101, 124, 103, 333/125, 126, 127, 129, 130, 132, 133, 117, 118; 343/852; 328/105; 455/6, 132, 140

[56] References Cited

U.S. PATENT DOCUMENTS

| | | | |
|---|---|---|---|
| 2,115,138 | 4/1938 | Darlington | 333/132 |
| 3,581,209 | 5/1971 | Zimmerman et al. | 455/6 |
| 3,710,260 | 1/1973 | Wright | 328/105 X |
| 3,806,813 | 4/1974 | Eller | 455/6 |
| 4,367,445 | 1/1983 | Dydyk | 333/127 |
| 4,556,856 | 12/1985 | Presser | 333/124 |

FOREIGN PATENT DOCUMENTS 128245 10/1979 Japan ................................. 333/132

OTHER PUBLICATIONS

Cohn, *A Class of Broadband Three-Port TEM-Mode Hybrids*, IEEE Trans. on MTT, Feb. 1968, pp. 110–116.
Head, *Synthesize Lumped Element In-Phase Power Dividers*, Microwave Journal, May 1980, pp. 111, 112.

*Primary Examiner*—Paul Gensler
*Attorney, Agent, or Firm*—Jordan C. Powell

[57] ABSTRACT

A miniature wide-band microwave power divider comprising a common terminal connected to a plurality of parallel signal paths with each signal path comprising a low pass and a high pass filter made up of discrete components. Use of discrete components allows the entire power divider to be incorporated on a single chip. Isolation is achieved between the signal paths by isolation means comprising resistors.

15 Claims, 2 Drawing Sheets

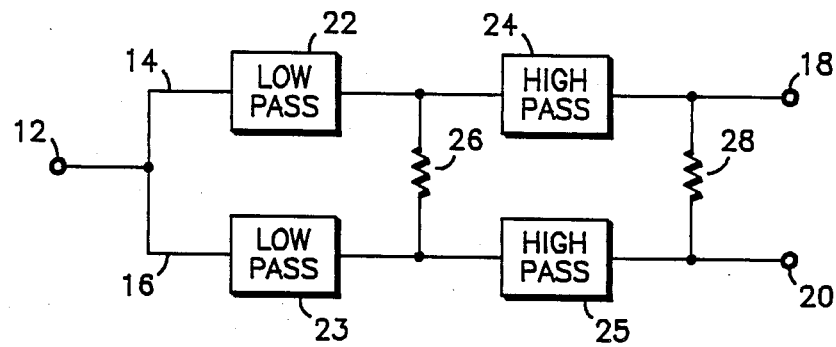
FIG. 1
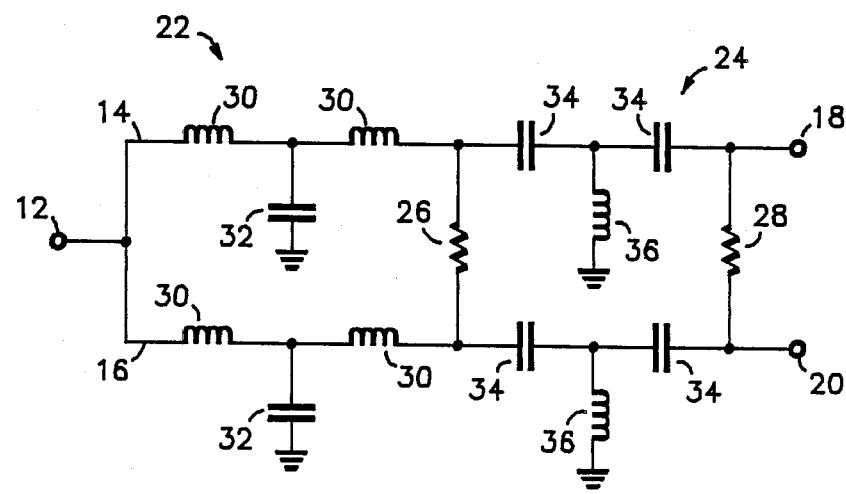
FIG. 2
FIG. 3
—PRIOR ART—
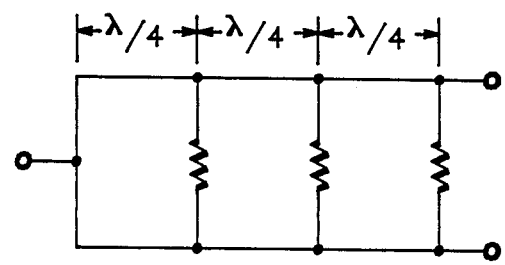

MINIATURE WIDE-BAND MICROWAVE POWER DIVIDER

BACKGROUND OF THE INVENTION

This invention relates, in general, to power dividers and combiners used in microwave systems, and more particularly, to wide-band power dividers and combiners which can be incorporated on a single miniature integrated circuit (I.C.) chip.

Powder dividers are used to take a signal at a common terminal and divide the signal among a series of signal paths while maintaining desired impedances at the common terminal and at all output terminals. The same apparatus can be used as a power combiner by feeding signals to each of the signal paths and combining these signals at the common terminal.

Conventional power dividers generally utilize quarter-wave transmission lines in their signal paths. These dividers are often referred to as Wilkinson power dividers since they incorporate isolated, branch waveguide power dividers as disclosed in U.S. Pat. No. 3,091,743 to Wilkinson. Wilkinson power dividers have good isolation between their output terminals. The bandwidth of Wilkinson power dividers is increased by cascading additional sections of the power divider, each section incorporating a quaterwave length transmission line. A correlation between bandwidth ratio and number of sections incorporating quarterwave length transmission lines is given in the following table which was developed by Seymor B. Cohn in "A Class of Broadband Three-Port TEM-Mode Hybrids", IEEE Transactions on Microwave Theory and Techniques, Vol. MTT-16, No. 2, February 1968.

TABLE 1

| Sections | 2 | 3 | 4 | 7 |
|---|---|---|---|---|
| Bandwidth Ratio (x:1) | 2.0 | 3.0 | 4.0 | 10.0 |

Thus, as the bandwidth increases, the size of the divider increases. Because of the increasing size of the divider with increasing bandwidth, Wilkinson type dividers with large bandwidths cannot readily be miniaturized to fit on a single chip.

Recent developments in technology have allowed the size of many electronic components to be reduced. The size of products using these components are undesirably increased if large dividers must be included therein. Hence, broadband Wilkinson dividers have become impractical for miniature applications. Some power dividers have been designed which replace transmission lines with discrete lumped element components. However, these have not had the bandwidth associated with cascaded Wilkinson dividers, and in fact, are limited to very narrow bandwidths. The prior art, therefore, has not provided a power divider with a broad bandwidth which can be miniaturized to fit on a single I.C. chip.

SUMMARY OF THE INVENTION

A wide-band microwave power divider/combiner is provided in accordance with this invention which can be miniaturized to fit on a single chip. To increase the bandwidth while maintaining good isolation performance, the invention contemplates coupling low pass filters and high pass filters in series along a plurality of signal paths and connecting the signal paths with isolation resistors. These filters comprise discrete components. By using discrete components, the entire wide-band power divider can be incorporated on a single I.C. chip.

It is, therefore, an object of the present invention to provide a wide-band microwave power divider/combiner.

Another object of the present invention is to miniaturize the power divider/combiner.

A further object of the present invention is to allow the power divider/combiner to be constructed in I.C. form.

Other objects and advantages of the present invention will become apparent from the following detailed description, particularly when considered in conjunction with the accompanying drawings.

BRIEF DESCRIPTION OF THE DRAWINGS

FIG. 1 is a block schematic diagram of a miniature wide-band microwave power divider in accordance with the present invention.

FIG. 2 is a schematic diagram of a circuit for a miniature wide-band microwave power divider in its preferred embodiment in accordance with the present invention.

FIG. 3 is a schematic diagram of a multi-section prior art Wilkinson power divider.

DETAILED DESCRIPTION OF THE PREFERRED EMBODIMENT

Figure 4:
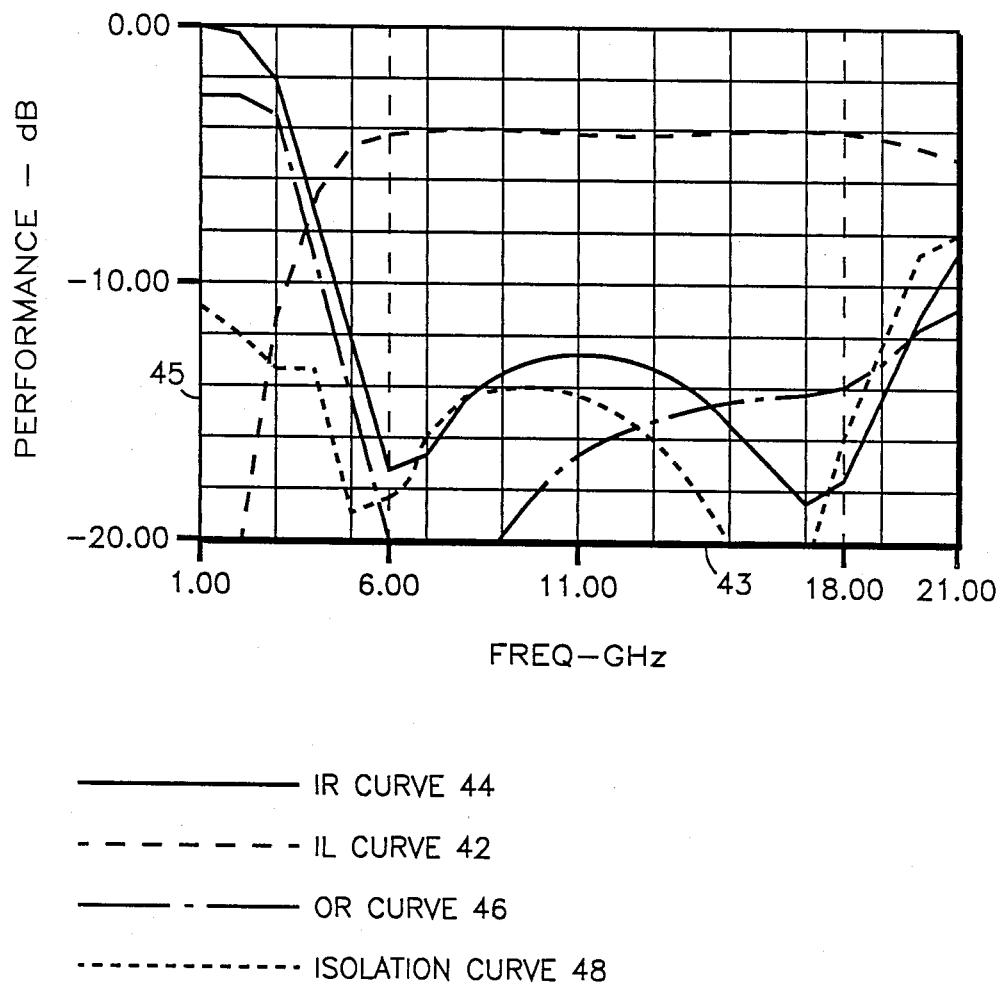
FIG. 4 is a chart showing performance characteristics for a miniature microwave power divider in accordance with the present invention.

A miniature wide-band microwave power divider 10, in its preferred embodiment and as diagrammed in the block schematic of FIG. 1, comprises a common input terminal 12, a plurality of parallel signal paths 14 and 16, and a plurality of output terminals 18 and 20. Signal path 14 comprises low pass filter 22 and high pass filter 24 and signal path 16 comprises low pass filter 23 and high pass filter 25. Signal path 14 is coupled to signal path 16 by low pass resistor 26 immediately after low pass filter 22, and high pass resistor 28 couples signal path 14 to signal path 16 immediately after high pass filter 24.

Within the industry, this apparatus is known as a "power divider" because it divides an input signal received at common terminal 12 between signal paths 14 and 16. The divided signals are then fed to outside loads through output terminals 18 and 20. This same type of structure acts to combine signals by feeding the signals through output terminals 18 and 20 and out through common terminal 12. In the industry, this is known as a "power combiner".

Low pass filter 22, in its preferred embodiment as shown in FIG. 2, comprises a low pass inductance 30 and low pass capacitance 32 arranged in a "tee" configuration with low pass capacitance 32 connected to ground. In the "tee" configuration, low pass inductance 30 comprises two discrete inductor components and low pass capacitance 32 comprises one discrete capacitor component. One with ordinary skill in the art will recognize that low pass filter 22 may be constructed in other configurations such as a "pi" configuration comprising one discrete inductor component and two discrete capacitor components. In one embodiment, low pass capacitance 32 has a value of 0.11 picoFarads (pF)

and low pass inductance 30 has a value of 0.84 henrys (H).

High pass filter 24, in its preferred embodiment, comprises high pass capacitance 34 and high pass inductance 36 arranged in a "tee" configuration with high pass inductance 36 connected to ground. High pass capacitance 34 comprises two discrete capacitor components and high pass inductance 36 comprises one discrete inductor component. As with low pass filter 22, high pass filter 24 may be constructed in other configurations such as a "pi" configuration. In one embodiment, high pass capacitance 34 has a preferred value of 0.5 pF and high pass inductance 36 has a preferred value of 1.5 H.

Low pass resistor 26 and high pass resistor 28 operate to isolate signal paths 14 and 16. In one embodiment, low pass resistor 26 is 100 ohms and high pass resistor 28 is 250 ohms.

In operation, assuming a 6 $GH_z$ lower cutoff frequency, high pass filter 24 provides impedance transformation and a 90° phase shift. Assuming an 18 $GH_z$ higher cutoff frequency, low pass filter 22 provides impedance transformation and the necessary 90° phase shift.

FIG. 4 shows frequency in Gigahertz ($GH_z$) along abscissa axis 43 and divider performance in decibels (db) along ordinate axis 45. Insertion loss (IL) performance curve 42 of FIG. 4 indicates an optimum frequency, between 6 and 18 GHz, for power divider 10 of FIG. 1. Within the bandwidth, input return loss (IR) of common terminal 12, shown by IR curve 44, output return loss (OR) of output terminals 18 and 20, shown by OR curve 46, and isolation between output terminals 18 and 20 shown by isolation curve 48, exhibit good performance.

By combining low pass filter 22 and high pass filter 24 in series, a relatively wide-band frequency range is obtained. The combination of low pass filter 22 and high pass filter 24 in power divider 10 yields substantially the same bandwidth as a 3-section cascaded Wilkinson-type transmission line power divider as shown in FIG. 3.

Power divider 10 is constructed entirely on a miniature chip due to use of discrete components in low pass filter 22 and high pass filter 24. Conversely, a Wilkinson-type transmission line power divider requires substantially more area than is available on a miniature chip due to the multi-lengths of transmission line. Although some isolation performance is given up as compared to the large prior art Wilkinson dividers to miniaturize power divider 10, power divider 10 still operates within a good performance range and is adequate for many applications.

Although a preferred embodiment of power divider 10 has been shown as having two parallel signal paths 14 and 16, it is contemplated within the scope of the present invention that power divider 10 may be used as an N-way power divider with N being a whole number greater than one. The difference between a two-way divider and an N-way divider with 3 or more signal paths is the design of the discrete components to obtain a consistent impedance transformation. In order for 50 ohms to be present at all ports (common terminal 12 and output terminals 18 and 20) of a two-way power divider, an impedance transformation from 100 ohms to 50 ohms is needed in each signal path. For 50 ohms to be present at all ports of an N-way power divider, the impedance transformation would be from (N×50) ohms to 50 ohms and the discrete components of low pass filter 22 and high pass filter 24 would be designed accordingly.

Thus, a miniature, wide-band microwave power divider with low pass filters and high pass filters incorporating discrete components has been described herein. While the invention has been described in conjunction with specific embodiments thereof, it is evident that many alternatives, modifications, and variations will be apparent to those skilled in the art in light of the foregoing description. Accordingly, the invention is intended to embrace all such alternatives, modifications and variations as fall within the spirit and broad scope of the appended claims.

I claim:

1. A miniature wide-band microwave hybrid comprising:
   a plurality of signal path means for dividing a power signal
   each of said signal path means comprising at least one low pass means and at least one high pass means;
   said low pass means and said high pass means in each of said signal path means coupled in series with an output means;
   said low pass means for passing signals below a predetermined maximum frequency;
   said high pass means for passing signals above a predetermined minimum frequency; and
   each of said signal path means allowing transmission of the same frequencies.

2. A miniature wide-band microwave hybrid according to claim 1 wherein said low pass means and said high pass means each include discrete components.

3. A miniature wide-band microwave hybrid according to claim 1 wherein said low pass means supplies a 90 degree phase shift at said predetermined maximum frequency, and said high pass means supplies a 90 degree phase shift at said predetermined minimum frequency.

4. A miniature wide-band microwave hybrid according to claim 1 wherein said low pass means comprises:
   inductance means;
   capacitance means;
   said inductance means coupled in series along said signal path means; and
   said capacitance means coupled between said signal path means and an electric ground.

5. A miniature wide-band microwave hybrid according to claim 1 wherein said high pass means comprises:
   inductance means for supplying an inductance;
   capacitance means for supplying a capacitance;
   said capacitance means coupled in series along said signal path means; and
   said inductance means coupled between said signal path means and an electric ground.

6. A miniature wide-band microwave hybrid according to claim 1 wherein said high pass means and said low pass means provide impedance transformation.

7. A miniature wide-band microwave hybrid according to claim 1 wherein said hybrid further includes a plurality of isolation means for electronically isolating one of said signal path means from another of said signal path means.

8. A miniature wide-band microwave hybrid according to claim 4 wherein said plurality of isolation means comprises a resistor.

9. A miniature wide-band microwave hybrid according to claim 7 wherein each of said plurality of isolation means couples one of said plurality of parallel signal path means to another of said plurality of parallel signal path means.

10. A miniature wide-band microwave hybrid according to claim 9 wherein one of said plurality of isolation means couples one of said plurality of parallel signal path means to another of said plurality of parallel signal path means after said low pass means, and another of said plurality of isolation means couples said plurality of signal path means after said high pass means.

11. A miniature wide-band microwave power divider comprising:

a plurality of signal path means for dividing a power signal;

each of said signal path means comprising at least one low pass means and at least one high pass means;

said low pass means and said high pass means in each of said signal path means coupled in series with an output means;

said low pass means for passing signals below a predetermined maximum frequency;

said high pass means for passing signals above a predetermined minimum frequency;

each of said signal path means allowing transmission of the same frequencesl;

a plurality of isolation means for electronically isolating one of said signal path means from another of said signal path means; and each of said isolation means coupling one of said plurality of parallel signal path means to another of said plurality of parallel signal path means.

12. A miniature wide-band microwave power divider according to claim 11 wherein said high pass means supplies a 90 degree phase shift at said predetermined minimum frequency.

13. A miniature wide-band microwave power divider according to claim 11 wherein said low pass means supplies a 90 degree phase shift at said predetermined maximum frequency.

14. A miniature wide-band microwave power divider according to claim 11 wherein said high pass means and said low pass means provide an impedance transformation.

15. A miniature wide-band microwave power divider according to claim 11 wherein said isolation means comprises a resistor.

* * * * *